(12) United States Patent
Tu et al.

(10) Patent No.: US 6,271,084 B1
(45) Date of Patent: Aug. 7, 2001

(54) METHOD OF FABRICATING A METAL-INSULATOR-METAL (MIM), CAPACITOR STRUCTURE USING A DAMASCENE PROCESS

(75) Inventors: Yeur-Luen Tu, Taichung; Chia-Shiung Tsai; Min-Hwa Chi, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/759,912

(22) Filed: Jan. 16, 2001

(51) Int. Cl.[7] .................................................. H01L 21/8242
(52) U.S. Cl. ........................... 438/253; 438/240; 438/254
(58) Field of Search .................................. 438/3, 238–241, 438/253–256, 381, 393–399

(56) References Cited

U.S. PATENT DOCUMENTS

| 5,518,948 | * | 5/1996 | Walker . | |
|---|---|---|---|---|
| 5,918,135 | | 6/1999 | Lee et al. ................................ | 438/393 |
| 6,074,913 | | 6/2000 | Lou et al. ................................ | 438/255 |
| 6,087,261 | | 7/2000 | Nishikawa et al. ................... | 438/685 |
| 6,184,081 | * | 2/2001 | Jeng et al. ............................. | 438/253 |

\* cited by examiner

*Primary Examiner*—Jey Tsai
(74) *Attorney, Agent, or Firm*—George O. Saile; Stephen B. Ackerman (57) ABSTRACT

A process for forming a vertical, metal-insulator-metal (MIM), capacitor structure, for embedded DRAM devices, using a damascene procedure, has been developed. The process features forming a capacitor opening in a composite insulator layer comprised of a overlying insulator stop layer, a low k insulator layer, and an underlying insulator stop layer, with a lateral recess isotropically formed in the low k insulator layer. After formation of a bottom electrode structure in the capacitor opening, a high k insulator layer is deposited followed by the deposition of a conductive layer, completely filling the capacitor opening. A chemical mechanical polishing procedure is then used to remove portions of the conductive layer, and portions of the high k insulator layer, from the top surface of the overlying insulator stop layer, resulting in the formation of the vertical MIM capacitor structure, in the capacitor opening, comprised of: a top electrode structure, defined from the conductive layer; a capacitor dielectric layer, formed from the high k insulator layer; and a bottom electrode structure.

24 Claims, 7 Drawing Sheets

METHOD OF FABRICATING A METAL-INSULATOR-METAL (MIM), CAPACITOR STRUCTURE USING A DAMASCENE PROCESS

BACKGROUND OF THE INVENTION (1) Field of the Invention

The present invention relates to methods used to fabricate semiconductor devices, and more specifically to a method used to fabricate a metal-insulator-metal (MIM), capacitor structure for a dynamic random access memory (DRAM), device.

(2) Description of Prior Art

The ability to merge DRAM arrays with logic circuits require complex process integration, in addition to the process difficulties encountered as a result of the topology created by the DRAM capacitor structures. The formation of crown shaped, DRAM capacitor structures, prior to formation of first level metal interconnections, require thick insulator layers to successfully cover the topology created by the DRAM capacitor structures. However the use of thick insulator layers, needed for coverage of the DRAM capacitor structures, requires the use for high aspect ratio contact openings, in the logic region. The use of high aspect ratio contact holes present process difficulties in terms of dry etching through the thick insulator layers, as well as difficulties encountered during the metal filling of the narrow diameter, deep openings. These process difficulties can result in yield loss for the logic chips comprised with embedded DRAM arrays. This invention will describe a fabrication process in which DRAM arrays are embedded in logic circuits, however with the DRAM devices featuring the use of a damascene procedure to fabricate a metal-insulator-metal (MIM), DRAM capacitor structure, thus alleviating the severe topology, and the process difficulties associated with this topology, created when using conventional crown shaped, DRAM capacitor structures. Prior art, such as Lee et al, in U.S. Pat. No. 5,918,135, as well as Nishikawa et al, in U.S. Pat. No. 6,087,261, describe the fabrication of MIM capacitor structures, however these prior arts do not describe the integration of embedded DRAM arrays with logic circuits, and do not describe the novel damascene process, described in the present invention, which allows reduced topology to be realized, thus reducing process complexity, for embedded DRAM array designs.

SUMMARY OF THE INVENTION

It is an object of this invention to provide a fabrication procedure for vertical MIM capacitor structures used in an embedded DRAM technology.

It is another object of this invention to reduce the topology created by DRAM capacitor structure via use of a damascene procedure used for fabrication of the vertical MIM capacitor structure, and via the formation of the DRAM, MIM capacitor structure performed after fabrication of the first metal interconnect structure.

It is still another object of this invention to use low temperature procedures for fabrication of the DRAM MIM capacitor structure, reducing the thermal impact on the logic device performance.

In accordance with the present invention a method of integrating the fabrication of DRAM devices with the fabrication of logic circuits, featuring vertical DRAM, MIM capacitor structures formed using a damascene process, has been developed. After formation of the transfer gate transistors for both the logic circuit and DRAM arrays, damascene type, first level metal interconnect structures are formed, contacting regions of the underlying transfer gate transistors. A composite insulator layer, comprised of an underlying insulator stop layer, a low k dielectric layer, and an overlying insulator stop layer, is deposited, followed by the formation of capacitor openings in the overlying stop layer, and in the low k dielectric layer of the composite insulator layer. An isotropic etch is next used to laterally recess the low k dielectric layer, in the capacitor opening. After removal of the portion of underlying stop layer, exposed in the capacitor opening, a bottom electrode layer is deposited, overlying and contacting the surface of the first level metal interconnect structure. An organic layer is used to protect the region of the bottom electrode layer residing in the capacitor opening, allowing the portion of the bottom electrode layer residing on the top surface of the overlying insulator stop layer to be removed, defining the bottom electrode structure. After formation of a capacitor dielectric layer, on the bottom electrode structure a conductive layer is deposited, completely filling the capacitor opening, then subjected to a chemical mechanical polishing procedure, to create a damascene type, top electrode, overlying the capacitor dielectric layer, in the capacitor opening. A damascene type, second level metal interconnect structure is then formed overlying and contacting the vertical MIM capacitor structure, residing in the capacitor opening.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
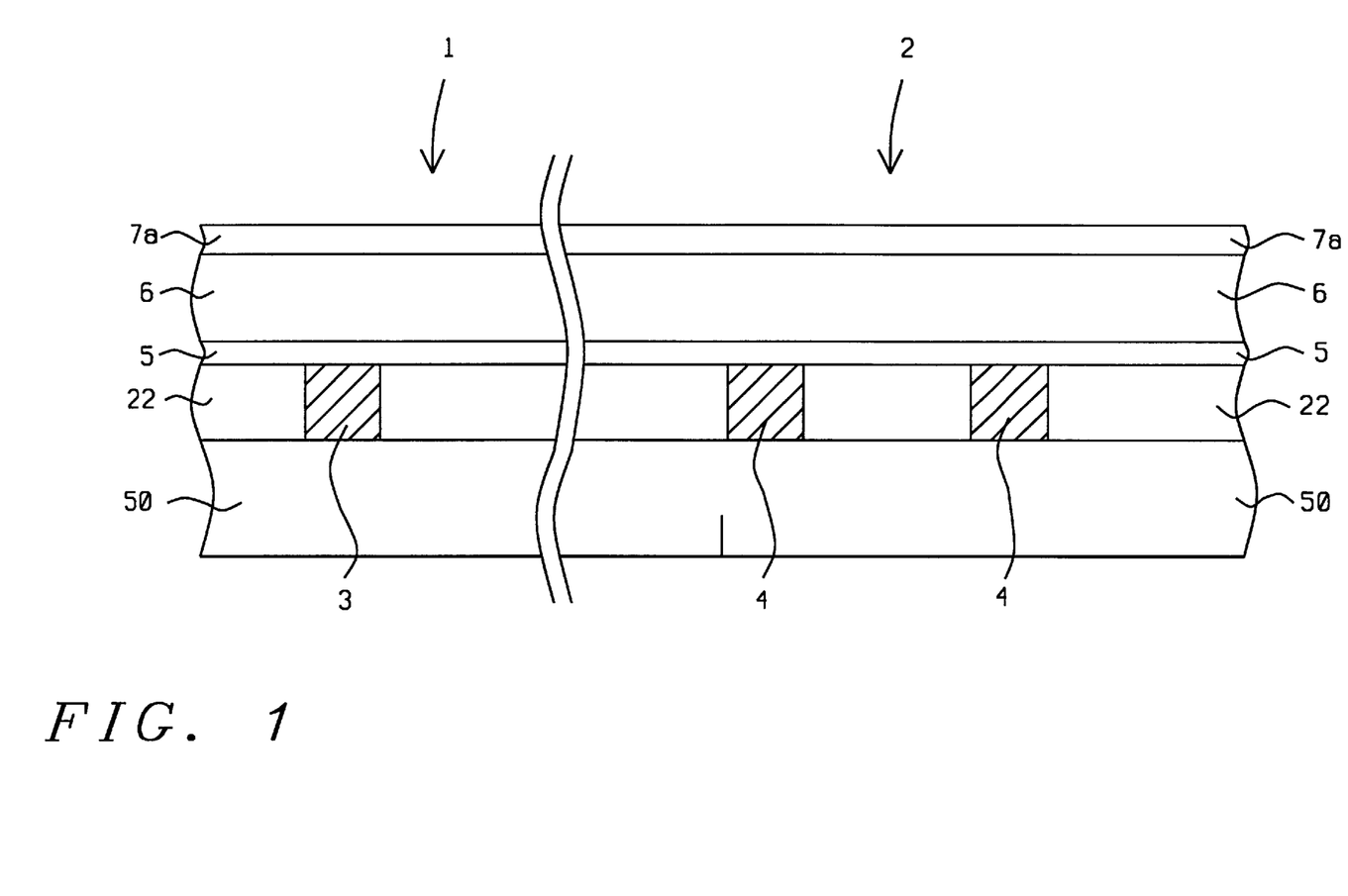
FIGS. 1–7, which schematically, in cross-sectional style, describe key stages of fabrication used to fabricate a vertical MIM capacitor structure, for embedded DRAM arrays.

The method of integrating the fabrication of DRAM devices, featuring vertical MIM capacitor structures formed using a damascene process, with the fabrication of logic circuits, will now be described in detail. A first region 1, of a semiconductor substrate 50, to be used for logic devices, and a second region 2, of semiconductor substrate 50, to be used for DRAM devices, is schematically shown in FIG. 1. Semiconductor substrate 50, is comprised with metal oxide semiconductor field effect transistor (MOSFET), devices, resistor structures, as well as various other elements used for logic and DRAM memory applications. These elements, located in, and on, semiconductor substrate 50, are not shown in the drawings. A first insulator layer 22, comprised of silicon oxide, or boro-phosphosilicate glass (BPSG), is deposited via low pressure chemical vapor deposition (LPCVD), or plasma enhanced chemical vapor deposition (PECVD), procedures, to a thickness between about 3000 to 6000 Angstroms. Insulator layer 22, shown schematically in FIG. 1, overlying semiconductor substrate 50, and the MOSFET devices, is subjected to a chemical mechanical polishing (CMP), procedure, resulting in a smooth top surface topology. Conventional photolithographic and dry etching procedures, using $CHF_3$ as an etchant for insulator layer 22, are used to create openings in insulator 22, allowing subsequent damascene type, first level metal interconnect structures top be formed in these openings. First level metal interconnect structure 3, in logic region 1, and first level metal interconnect structures 4, in DRAM region 2, are formed via deposition of a metal layer, such as copper, at a thickness between about 3000 to 10000 Angstroms, completely filling the openings in insulator layer 22. Removal of portions of metal from the top surface of insulator layer 22, via CMP, or via a selective, reactive ion etching (RIE), procedure, using $Cl_2$ as an etchant, result in the damascene type, first level metal interconnect structures, shown in FIG. 1. First level metal interconnect structures 4, overlay and contact source/drain regions of a MOSFET transfer gate transistors, in DRAM region 2, while first level metal interconnect structure 3, overlays and contacts a source/drain region of a MOSFET transfer gate transistor, in logic region 1.

A first insulator stop layer 5, comprised of silicon oxynitride, or silicon carbide, is next deposited, at a thickness between about 300 to 600 Angstroms via LPCVD or PECVD procedures. This is followed by deposition, or application of, low k dielectric layer 6, comprised of an inorganic silicon based CVD layer, such as black diamond, coral, or comprised of a spin on, low k layer such as SILK, Flair, or HOSP, obtained at a thickness between about 5000 to 12000 Angstroms, with a dielectric constant for low k dielectric layer 6, of less than 3. Second insulator stop layer 7a, comprised of silicon nitride or silicon carbide, is then deposited via LPCVD or PECVD procedures, at a thickness between about 800 to 1200 Angstroms. The result of these depositions is schematically shown in FIG. 1.

Figure 2:
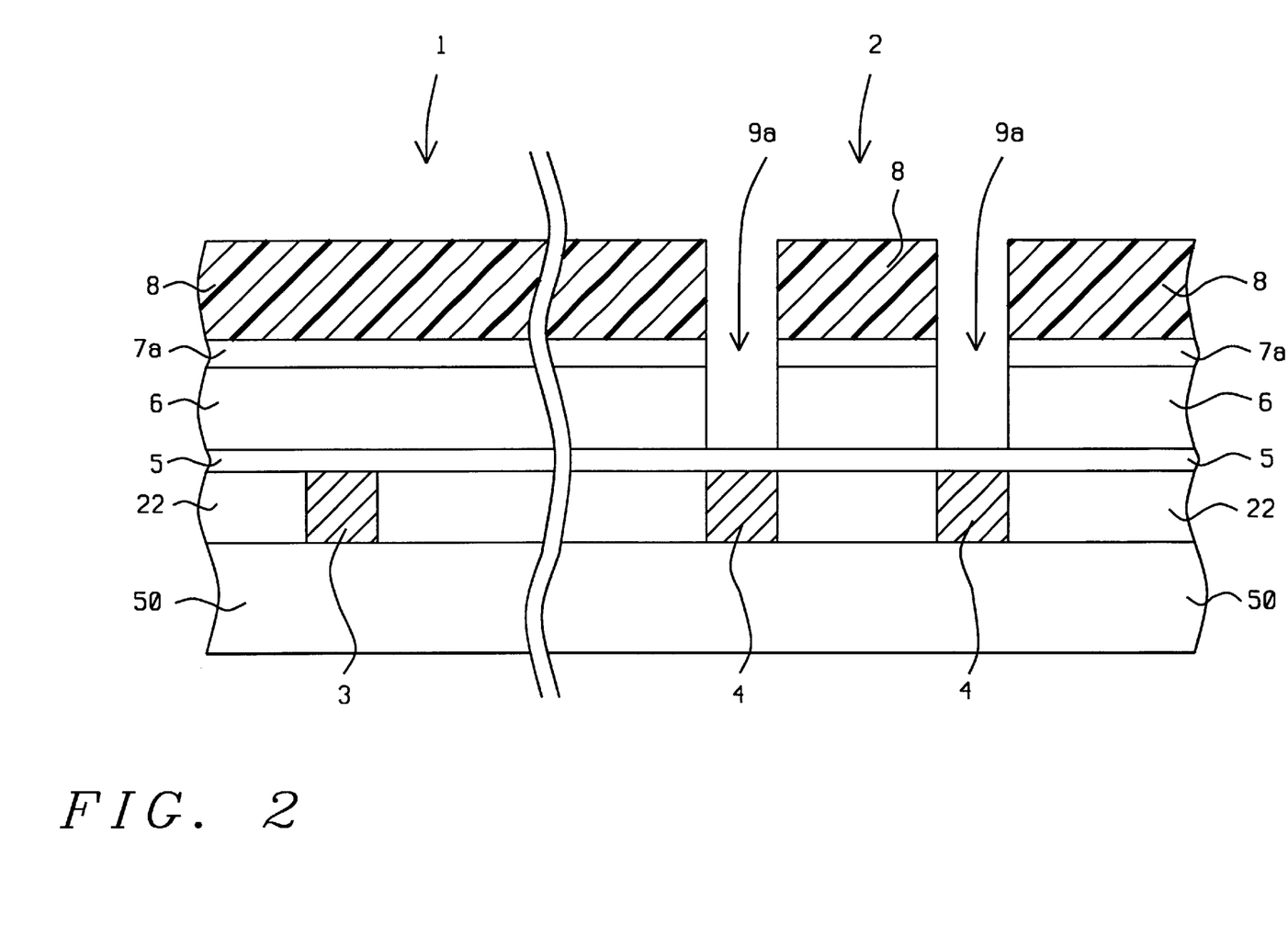
Figure 3:
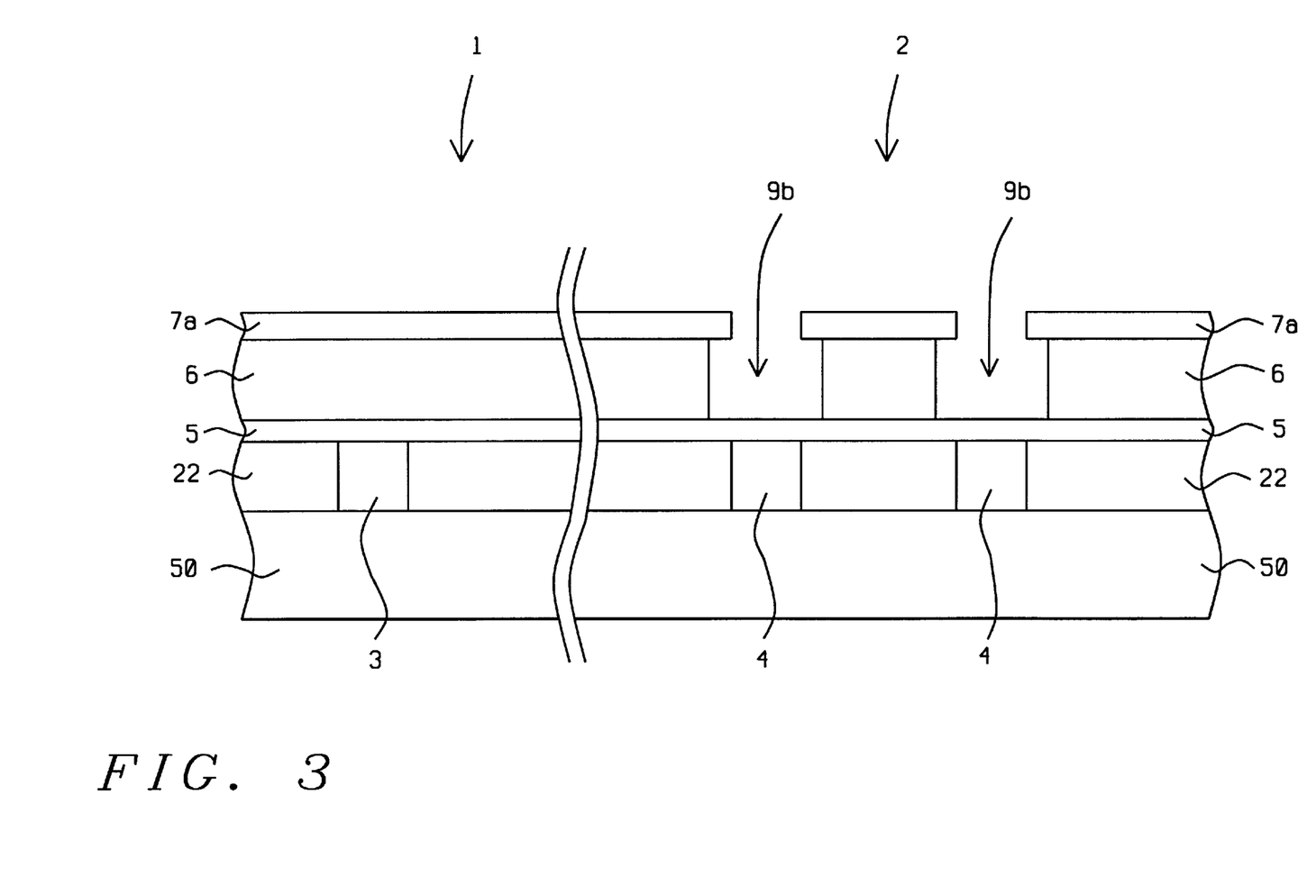

Photoresist shape 8, is next employed as an etch mask to allow first opening 9a, to be formed in second insulator stop layer 7a, and in low k dielectric layer 6, via an anisotropic RIE procedure, using $CHF_3/CF_4/O_2$ as an etchant for second insulator stop layer 7a, and using $CHF_3/CF_4/C_4F_8/Ar/CO$ for the CVD formed low k dielectric layer 6, while using $N_2/H_2/NH_3$ when a spin on low k dielectric layer 6, is employed, with the etching terminating at the appearance of first insulator stop layer 5. The result of this anisotropic RIE procedure is schematically shown in FIG. 2. After removal of photoresist shape 8, via plasma oxygen ashing and careful wet cleans, a selective, isotropic etching procedure is employed to laterally recess low k dielectric layer 6, creating second opening 9b. The lateral recess in low k dielectric layer 6, between about 500 to 1000 Angstroms, shown schematically in FIG. 3, is accomplished using either wet procedures, such as exposure to a buffered hydrofluoric acid solution, or exposure to a dry etch environment using $CHF_3/O_2$ as an etchant, and at a chamber pressure needed to deliver the desired isotropic etch component.

Figure 4:
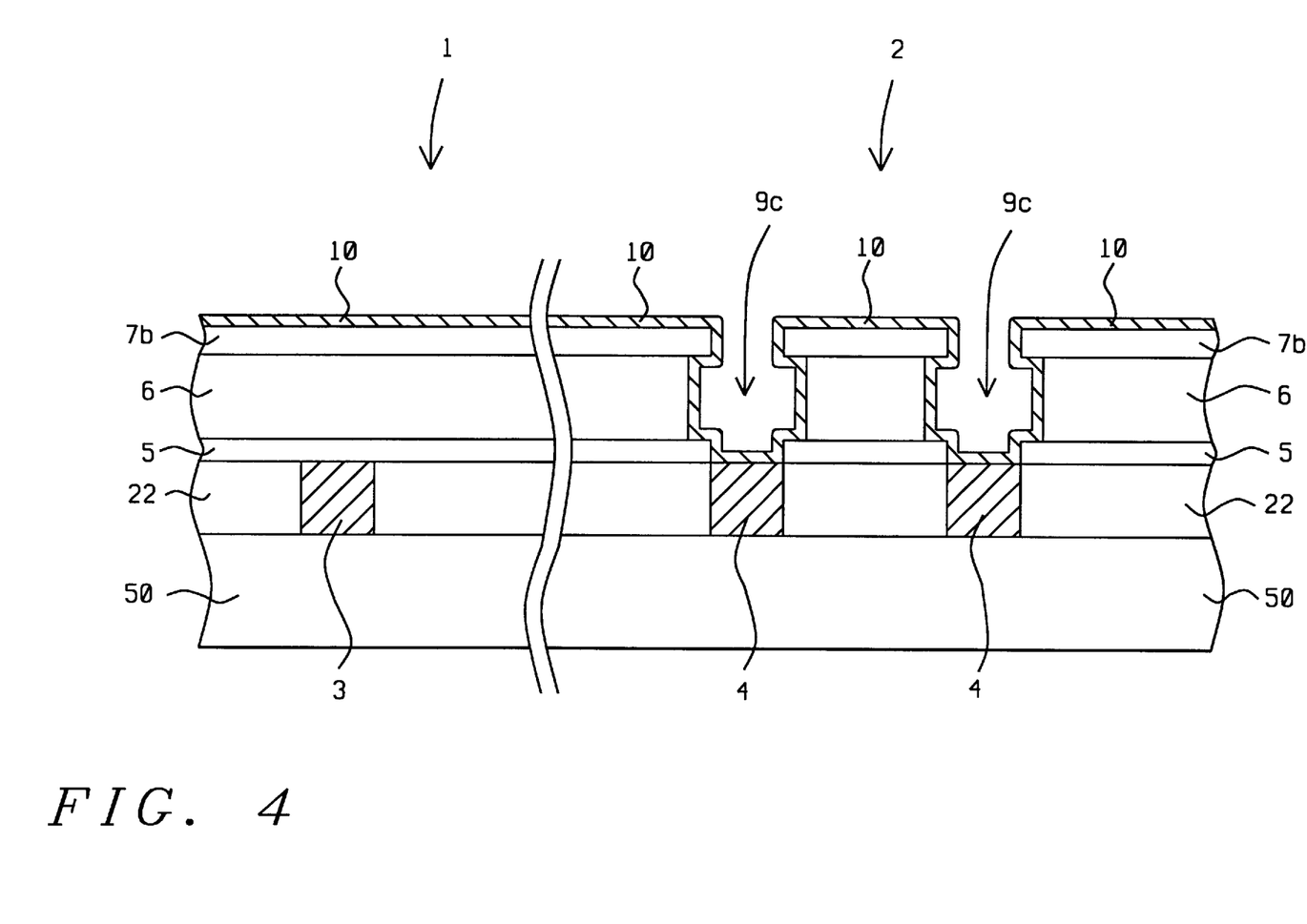

An anisotropic, blanket etch back procedure is next employed to remove only the portions of first insulator stop layer 5, exposed in second openings 9b, creating capacitor openings 9c. This is accomplished using $CHF_3$ as an etchant, with the blanket etch procedure removing a top portion of second insulator stop layer 7a, resulting in a thinner second insulator stop layer 7b, now at a thickness between about 400 to 800 Angstroms. The thickness of second insulator stop layer 7a, compared to the thinner, first insulator stop layer 5, allowed this procedure to be accomplished without total removal of second insulator stop layer 7a. Conductive layer 10, to be used as the capacitor bottom layer, or capacitor bottom electrode structure, is comprised of titanium nitride, or of tungsten on titanium nitride (W/TiN), is next deposited via chemical vapor deposition (CVD), procedures, at a temperature between about 300 to 450° C., to a thickness between about 400 to 600 Angstroms. The excellent conformality, and low deposition temperature, presented via the CVD procedure, allowed conductive layer 10, to coat all surfaces of capacitor opening 9c. This is schematically shown in FIG. 4. The thickness of conductive layer 10, is designed to be slightly less than the lateral recess in low k dielectric layer 6.

Figure 5:
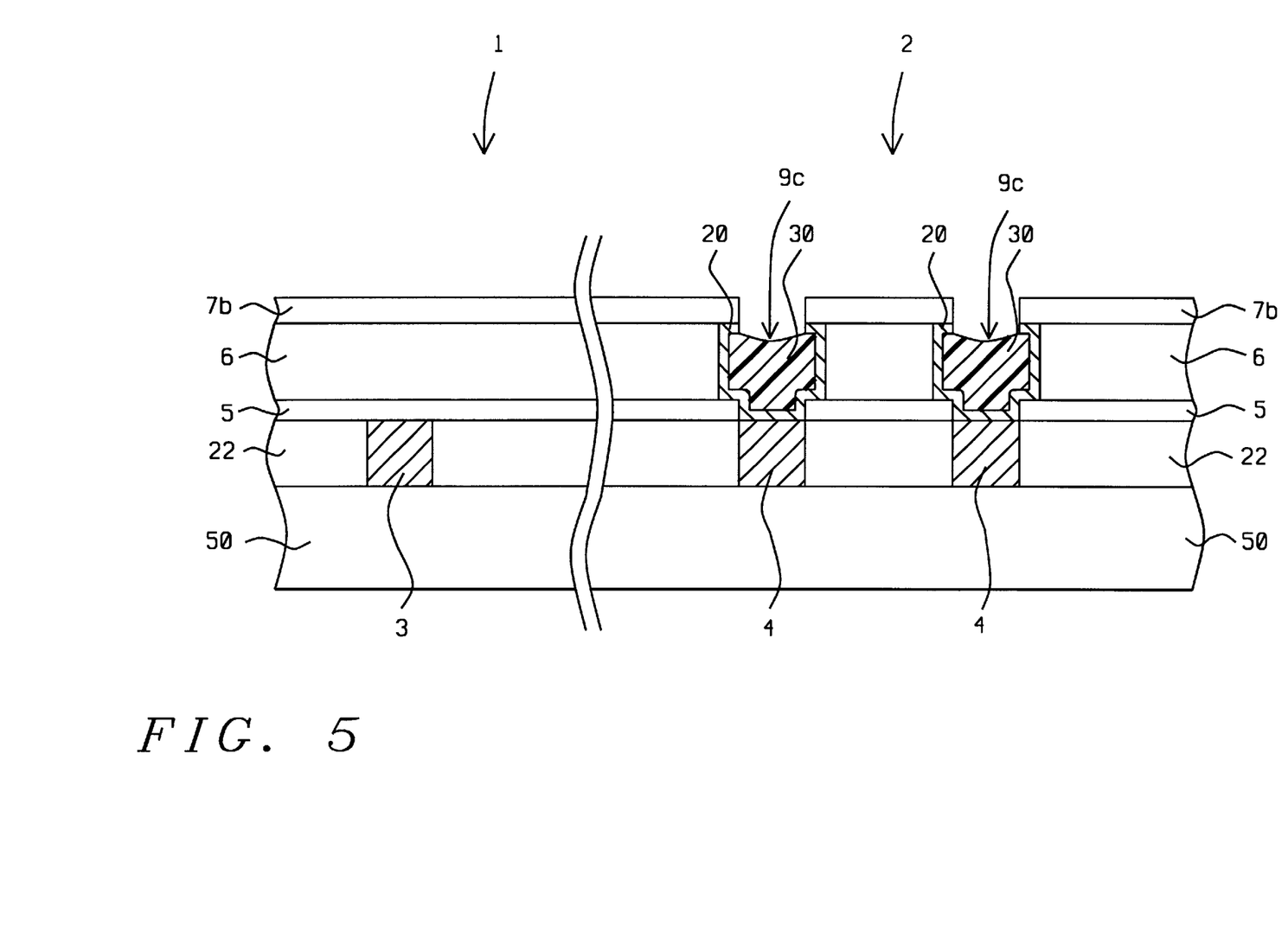

An organic layer, such as a photoresist, or a spin on organic material, is next applied, followed by a blanket, dry etch back procedure, using oxygen as an etchant, resulting in organic protection shape 30, in capacitor opening 9c, with organic protection shape 30, overlying the bottom portion of conductive layer 10. An additional option for obtaining organic protection shape 30, can be accomplished by partial exposure of an organic, photo sensitive material, followed by development, or selective removal of the exposed portion of the photosensitive organic layer, resulting in an non-exposed, non-developed, organic protection shape 30, located in capacitor opening 9c. Organic protection shape 30, is then used as an etch mask, protecting the portion of conductive layer 10, located at the bottom of capacitor opening 9c, from an anisotropic dry etch used to remove the unprotected portions of conductive layer 10. This is accomplished using $Cl_2$ or $SF_6$ as an etchant, resulting in selective removal of conductive layer 10, from the top surface of second insulator stop layer 7b, and selective removal of unprotected portions of conductive layer 10, from the exposed sides of second insulator stop layer 7b, with bottom electrode structure 20, now defined from the portion of conductive layer 10, protected by organic protection shape 30. This is schematically shown in FIG. 5.

Figure 6:
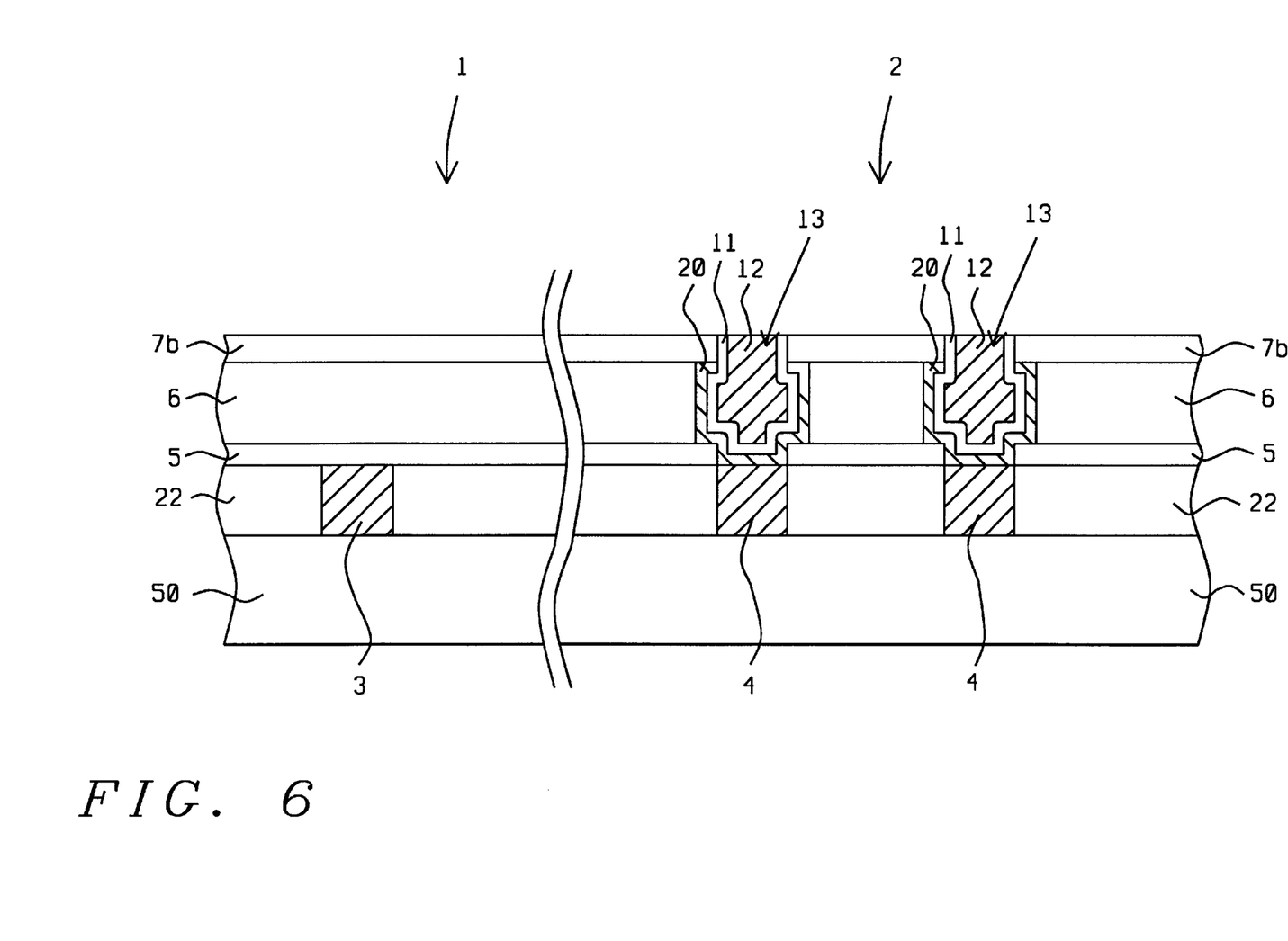

Organic protection shape 30, is next removed via plasma oxygen ashing and careful wet clean procedures. A high k dielectric layer 11, such as $Ta_2O_5$, is then deposited via chemical vapor deposition (CVD), procedures, at a thickness between about 30 to 100 Angstroms. The use of CVD for deposition of high k dielectric layer 11, comprised with a dielectric constant between about 20 to 40, results in increased conformality when compared to counterpart $Ta_2O_5$ layers obtained using plasma vapor deposition procedures. Deposition of the layer to be used for the capacitor top electrode structure is next addressed. A conductive layer such as tungsten, tungsten silicide, or titanium nitride, is next deposited via CVD procedures, to a thickness between about 500 to 2000 Angstroms, completely filling capacitor opening 9c. A chemical mechanical polishing (CMP), procedure is then employed to remove portions of the conductive layer from the top surface of second insulator stop layer 7b, resulting in the definition of top electrode structure 12, in capacitor opening 9c. This is schematically shown in FIG. 6. The CMP procedure also removes portions of high k dielectric layer 11, from the top surface of second insulator stop layer 10. The damascene type, capacitor structure 13, located in capacitor opening 9c, is comprised of overlying top electrode structure 12, high k dielectric layer 11, and underlying bottom electrode structure 20.

Figure 7:
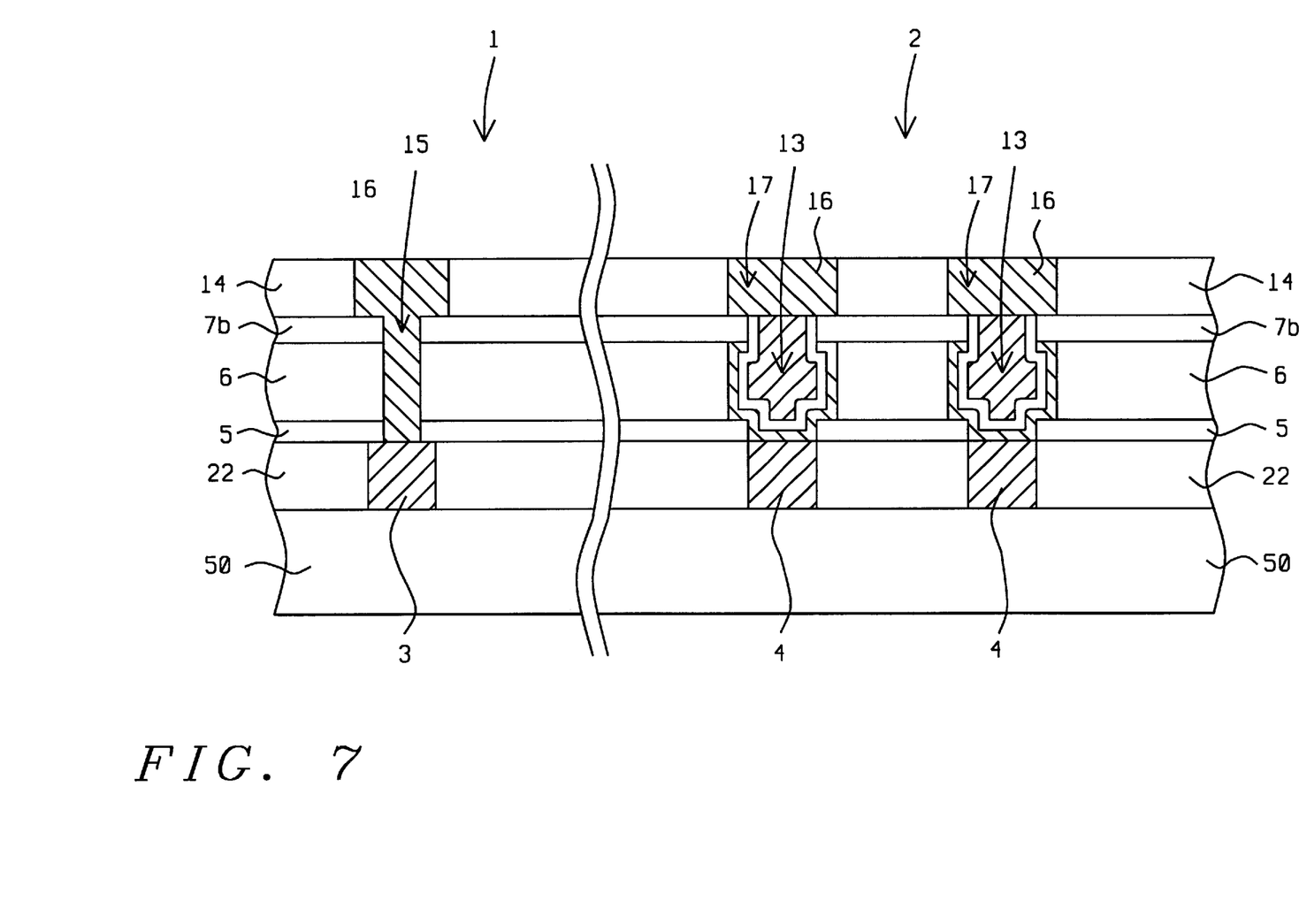

Low k dielectric layer 14, similar to low k dielectric layer 6, again comprised of either black diamond, or a spin on low k (SiLK), is next deposited, or applied, at a thickness between about 5000 to 12000 Angstroms. A dual damascene opening is formed in low k dielectric layer 14, in logic region 1, while a conventional opening is formed in the same low k dielectric layer 14, in DRAM region 2. To establish dual damascene opening 15, in logic region 1, a photoresist shape, not shown in the drawings, is used as an etch mask to allow a narrow diameter via hole to be formed in low k dielectric layer 14, in second insulator stop layer 7b, and in low k dielectric layer 6, exposing a portion of the top surface of first level metal interconnect structure 3. The narrow diameter via hole is formed via an anisotropic RIE procedure, using $CHF_3$ or $CF_4$ as an etchant. After removal of the photoresist shape used to define the narrow diameter via hole, another photoresist shape, again not shown in the drawings, is used as an etch mask to define wide diameter, or trench openings 17, in low k dielectric layer 14, in DRAM region 2, exposing the top surface of capacitor structures 13. Again an anisotropic RIE procedure, using $CF_3$ or $CF_4$ is employed as an etchant. In addition to definition of wide diameter openings 17, in low k dielectric layer 14, in DRAM region 2, the same photoresist shape and anisotropic RIE procedure allows a wide diameter opening to be established in low k dielectric layer 14, in logic region 1, resulting in desired dual damascene opening 15. After removal of the photoresist shape used for definition of the wide diameter openings, a barrier layer of titanium nitride is deposited via CVD procedures, followed by deposition of a copper layer, completely filling dual damascene opening 15, as well as wide diameter openings 17. A CMP procedure is then used to remove portions of copper and titanium nitride from the top surface of low k dielectric layer 14, resulting in the formation of second level metal interconnect structures 16, located in dual damascene opening 15, in logic region 1, as well as located in wide diameter openings 17, in DRAM region 2. This is schematically shown in FIG. 7.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal-insulator-metal (MIM), capacitor structure, on a semiconductor substrate, using a damascene process, comprising the steps of:

providing a metal interconnect structure, embedded in an insulator layer, with said metal interconnect structure overlying and contacting a conductive region in said semiconductor substrate;

forming a composite insulator layer, comprised of an underlying, first insulator stop layer, a low dielectric constant, (low k), insulator layer, and an overlying second insulator stop layer;

anisotropically forming a first capacitor opening in said second insulator stop layer, and in said low k insulator layer;

isotropically forming a lateral recess in said low k insulator layer;

removing portion of said first insulator stop layer, exposed in said first capacitor opening, to form a final capacitor opening, exposing a portion of a top surface of said metal interconnect structure;

forming a bottom electrode structure in said final capacitor opening, with said bottom electrode structure overlying and contacting said metal interconnect structure;

depositing a high dielectric constant (high k), insulator layer;

depositing a metal layer, completely filling said final capacitor opening; and removing portions of said metal layer, and of said high k insulator layer from a top surface of said second insulator stop layer, resulting in a damascene type, capacitor structure, in said final capacitor opening, with said capacitor structure comprised of a top electrode structure, formed from said metal layer, a capacitor dielectric layer, formed from said high k insulator layer, and an underlying bottom electrode structure.

2. The method of claim 1, wherein said conductive region in said semiconductor substrate, is a source/drain region of a metal oxide semiconductor field effect transistor (MOSFET), device.

3. The method of claim 1, wherein said metal interconnect structure is a damascene copper interconnect structure.

4. The method of claim 1, wherein said first insulator stop layer, of said composite insulator layer, is comprised of either silicon oxynitride, or silicon carbide, obtained via LPCVD or PECVD procedures, at a thickness between about 300 to 600 Angstroms.

5. The method of claim 1, wherein said low k insulator layer, of said composite insulator layer, is comprised of a spin on low k dielectric layer such as SILK, Flair, or HOSP, applied at a thickness between about 5000 to 120000 Angstroms, with a dielectric constant of less than 3.

6. The method of claim 1, wherein said second insulator stop layer, of said composite insulator layer, is comprised of either silicon nitride, or silicon carbide, obtained via LPCVD or PECVD procedures, at a thickness between about 800 to 1200 Angstroms.

7. The method of claim 1, wherein said first capacitor opening is formed in said second insulator stop layer, and in said low k insulator layer, via an anisotropic RIE procedure, using $CF_4/CHF_3/O_2$ as an etchant for said second insulator stop layer, and using $N_2/H_2/NH_3$ as an etchant for said low k insulator layer.

8. The method of claim 1, wherein said lateral recess, in said low k insulator layer, is between about 500 to 1000 Angstroms, isotropically formed using either a buffered hydrofluoric acid solution, or a dry etching procedure, using $CHF_3/O_2$ as an etchant.

9. The method of claim 1, wherein portion of said first insulator stop layer exposed in said first capacitor opening, is removed via an anisotropic RIE procedure, using $CHF_3$ as an etchant.

10. The method of claim 1, wherein said bottom electrode structure is comprised of titanium nitride, or of tungsten on titanium nitride, obtained via CVD procedures at a thickness between about 400 to 600 Angstroms.

11. The method of claim 1, wherein said high k insulator layer, used as a capacitor dielectric layer, is comprised of $Ta_2O_5$, obtained via chemical vapor deposition procedures to a thickness between about 30 to 100 Angstroms, with a dielectric constant between about 20 to 40.

12. The method of claim 1, wherein said metal layer, to be used for capacitor top electrode, is comprised of tungsten, tungsten silicide, or titanium nitride, obtained via CVD procedures at a thickness between about 500 to 2000 Angstroms.

13. A method of fabricating a damascene, vertical metal-insulator-metal capacitor structure, for embedded dynamic random access memory (DRAM), devices, on a semiconductor substrate, comprising the steps of:

providing a first level copper interconnect structure, embedded in an insulator layer, with said first level copper interconnect structure overlying and contacting a MOSFET device source/drain region in said semiconductor substrate;

depositing a first insulator stop layer;

supplying a first low dielectric constant (low k), insulator layer;

depositing a second insulator stop layer;

performing a first anisotropic dry etching procedure to form a first capacitor opening in said second insulator stop layer and in said first low k insulator layer;

performing an isotropic etch to create a lateral recess in said first low k insulator layer;

performing a second anisotropic dry etching procedure to remove a portion of said first insulator layer exposed in said first capacitor opening, forming a final capacitor opening, exposing a portion of said first level copper interconnect structure;

depositing a first conductive layer;

forming an organic plug structure on a portion of said first conductive layer located in said final capacitor opening;

performing a third anisotropic dry etching procedure to remove portions of said first conductive layer not covered by said organic plug, forming a bottom electrode structure in said final capacitor opening, with said bottom electrode structure overlying and contacting said first level copper interconnect structure;

depositing a high dielectric constant (high k), insulator layer;

depositing a second conductive layer completely filling said final capacitor opening;

removing portions of said second conductive layer, and portions of said high k insulator layer, from the top portion of said second insulator stop layer, creating said damascene, vertical metal-insulator-metal, capacitor structure in said final capacitor opening, with said damascene, vertical metal-insulator-metal capacitor structure comprised of a top electrode structure formed from said second conductive layer, a capacitor dielectric layer formed from said high k insulator layer, and said underlying bottom electrode structure;

depositing a second low k insulator layer; and forming a second level copper interconnect structure in an opening in said second low k insulator layer, with said second level copper interconnect structure overlying and contacting said damascene, vertical metal-insulator-metal capacitor structure.

14. The method of claim 13, wherein said first insulator stop layer is comprised of either silicon oxynitride, or silicon carbide, obtained via LPCVD or PECVD procedures, at a thickness between about 300 to 600 Angstroms.

15. The method of claim 13, wherein said low k insulator layer, of said composite insulator layer, is comprised of a spin on low k layer), such as SiLK, Flair, or HOSP, applied at a thickness between about 5000 to 120000 Angstroms, with a dielectric constant of less than 3.

16. The method of claim 13, wherein said second insulator stop layer is comprised of either silicon nitride, or silicon carbide, obtained via LPCVD or PECVD procedures, at a thickness between about 800 to 1200 Angstroms.

17. The method of claim 13, wherein said first anisotropic RIE procedure, used to form said first capacitor opening in said second insulator stop layer, and in said low k insulator layer, is performed using $CF_4/CHF_3/O_2$ as an etchant for said second insulator stop layer, and using $N_2/H_2/NH_3$ as an etchant for said low k insulator layer.

18. The method of claim 13, wherein said isotopic etch procedure used to from a lateral recess in said low k insulator layer of between about 500 to 1000 Angstroms, is performed using either a wet etch procedure using a buffered hydrofluoric acid solution, or performed using a dry etching procedure, using $CHF_3/O_2$ as an etchant.

19. The method of claim 13, wherein said second anisotropic RIE procedure, used to remove a portion of said first insulator stop layer exposed in said first capacitor opening, is performed via an anisotropic RIE procedure, using $CHF_3$ as an etchant.

20. The method of claim 13, wherein said first conductive layer, used for formation of said bottom electrode structure, is comprised of titanium nitride, or of tungsten on titanium nitride, obtained via CVD procedures at a thickness between about 400 to 600 Angstroms.

21. The method of claim 13, wherein said third anisotropic RIE procedure, used to define said bottom electrode structure in said first conductive layer, is performed using $Cl_2$ or $SF_6$ as an etchant.

22. The method of claim 13, wherein said high k insulator layer, used as a capacitor dielectric layer, is comprised of $Ta_2O_5$, obtained via chemical vapor deposition procedures to a thickness between about 30 to 100 Angstroms, with a dielectric constant between about 20 to 40 Angstroms.

23. The method of claim 13, wherein said second conductive layer, used for said top electrode structure, is comprised of tungsten, tungsten silicide, or titanium nitride, obtained via CVD procedures at a thickness between about 500 to 2000 Angstroms.

24. The method of claim 13, wherein said second low k insulator layer, is comprised of a spin on low k layer such as SiLK, Flair, or HOSP, applied at a thickness between about 5000 to 120000 Angstroms, with a dielectric constant of less than 3.

* * * * *